United States Patent
Hsieh et al.

(10) Patent No.: US 11,312,616 B1
(45) Date of Patent: Apr. 26, 2022

(54) STRUCTURE OF MICRO-ELECTRO-MECHANICAL-SYSTEM MICROPHONE AND METHOD FOR FABRICATING THE SAME

(71) Applicant: Solid State System Co., Ltd., Hsinchu (TW)

(72) Inventors: Tsung-Min Hsieh, New Taipei (TW); Chien-Hsing Lee, Hsinchu County (TW); Cheng-Wei Tsai, Taichung (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 17/081,995

(22) Filed: Oct. 27, 2020

(51) Int. Cl.
| | | |
|---|---|---|
| *H04R 19/00* | (2006.01) | |
| *B81B 3/00* | (2006.01) | |
| *B81C 1/00* | (2006.01) | |
| *H04R 19/04* | (2006.01) | |
| *H04R 31/00* | (2006.01) | |

(52) U.S. Cl.
CPC ........ *B81B 3/0021* (2013.01); *B81C 1/00158* (2013.01); *H04R 19/04* (2013.01); *H04R 31/003* (2013.01); *B81B 2201/0257* (2013.01); *B81B 2203/0127* (2013.01); *H04R 2201/003* (2013.01)

(58) Field of Classification Search
CPC .......... B81B 3/0021; B81B 2201/0257; B81B 2203/0127; B81C 1/00158; H04R 19/04; H04R 31/003; H04R 2201/003
See application file for complete search history.

(56) References Cited

U.S. PATENT DOCUMENTS

| | | | |
|---|---|---|---|
| 10,250,998 B2 | 4/2019 | Hsieh et al. | |
| 2011/0278683 A1* | 11/2011 | Kasai | H04R 19/005 257/416 |
| 2019/0394573 A1* | 12/2019 | Cheng | H04R 19/005 |

* cited by examiner

*Primary Examiner* — Matthew A Eason
(74) *Attorney, Agent, or Firm* — JCIPRNET (57) ABSTRACT

A structure of micro-electro-mechanical-system (MEMS) microphone includes a substrate, having a first opening. A dielectric layer is disposed on the substrate, wherein the dielectric layer has a second opening aligned to the first opening. A membrane is disposed within the second opening of the dielectric layer. A peripheral region of the membrane is embedded into the dielectric layer at sidewall of the second opening. A backplate layer is disposed on the dielectric layer. The backplate layer includes a protection layer, having a peripheral region disposed on the dielectric layer and a central region with venting holes over the second opening. The central region of the protection layer further has anti-sticky structures at a side of the protection layer toward the membrane. An electrode layer is disposed on the side of the protection layer, surrounding the anti-sticky structures.

18 Claims, 6 Drawing Sheets

STRUCTURE OF MICRO-ELECTRO-MECHANICAL-SYSTEM MICROPHONE AND METHOD FOR FABRICATING THE SAME

BACKGROUND

1. Field of the Invention

The invention is related to semiconductor fabrication, and particularly related to the structure of micro-electro-mechanical-system (MEMS) microphone and the method for fabricating the MEMS microphone.

2. Description of Related Art

MEMS device, such as MEMS microphone, has been popular due to the excellent features comparing to the conventional ECM microphone. The features of MEMS microphone include: thin and small size; SMD (surface mountable device) indicating easy assembly with sold flow; and high stability and environmental resistance. Particularly, a MEMS microphone with greatly reduced size is suitable for various applications.

The conventional structure of MEMS device is based on a silicon substrate. The substrate has an opening corresponding to a membrane region to expose the membrane. A dielectric support layer on the substrate has an opening to define the membrane region. A passivation layer is disposed on the dielectric support layer. The dielectric support layer holds the backplate and the membrane. The backplate has multiple venting holes. A chamber is formed between the membrane and the backplate. The passivation layer also has an opening to expose the membrane.

For the conventional structure of MEMS device, such MEMS microphone, the membrane and the backplate are applied with two operation voltage levels to form as a capacitance during operation. The membrane senses the pressure of acoustic signal and changes the capacitances, so that the acoustic signal is transformed into electric signal for use in the puerperal electronic circuit.

In operation, the membrane senses pressure of acoustic signal so that the membrane keeps on vibrating. To increase the sensibility, the capacitance between the membrane and the backplate is reduced to improve the capacitance and then improve the sensibility. However, when the gap between the membrane and the backplate is rather reduced, the membrane may stick to the backplate in local region or a large region, causing the malfunction of the MEMS microphone.

The design of the MEMS phone is still under developing to improve the performance.

SUMMARY OF THE INVENTION

The invention provides a structure of MEMS microphone and a method for fabricating the MEMS microphone. The anti-sticky structure may be formed on the backplate to effectively avoid the membrane from sticking to the backplate.

In an embodiment, the invention provides a MEMS microphone. A structure of the MEMS microphone includes a substrate, having a first opening. A dielectric layer is disposed on the substrate, wherein the dielectric layer has a second opening aligned to the first opening. A membrane is disposed within the second opening of the dielectric layer. A peripheral region of the membrane is embedded into the dielectric layer at sidewall of the second opening. A backplate layer is disposed on the dielectric layer. The backplate layer includes a protection layer, having a peripheral region disposed on the dielectric layer and a central region with venting holes over the second opening. The central region of the protection layer further has anti-sticky structures at a side of the protection layer toward the membrane. An electrode layer is disposed on the side of the protection layer, surrounding the anti-sticky structures.

In an embodiment, the invention provides a method for fabricating MEMS microphone, including providing a substrate. In addition, a dielectric layer is formed on the substrate, wherein a membrane is embedded in the dielectric layer. An electrode layer is formed on the dielectric layer, wherein the electrode layer has a plurality of first openings and a plurality of second openings over the membrane, wherein the second openings are distributed surrounding the first openings. An indent is formed in the dielectric layer within each of the second openings of the electrode layer. A protection layer is formed for covering on the electrode layer to form a backplate layer, wherein a portion of the dielectric layer with the indents within the second openings are also covered by the protection layer while a portion of the dielectric layer within the first openings of the electrode layer is exposed by the protection layer. A first electrode structure is formed in the dielectric to contact the membrane and a second electrode structure on the protection layer to contact the electrode layer. The substrate is patterned to have a substrate opening corresponding to the membrane to expose the dielectric layer. A portion of the dielectric layer corresponding to the substrate opening is etched to expose a portion of the membrane. The electrode layer is also exposed and a portion of the protection layer within the second openings of the electrode layer is also exposed to form anti-sticky structures.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to a structure of MEMS microphone and the method for fabricating the MEMS microphone. The MEMS microphone has the backplate layer with anti-sticky structure, so that the situation for the membrane being sticking to the backplate may be effectively reduced.

The anti-sticky structure may be formed as a part of the protection layer of the backplate layer but penetrates through the electrode layer of the backplate layer, in which the backplate layer as formed includes the protection layer and the electrode layer. The protection layer provides the mechanical strength and supporting the electrode layer.

Several embodiments are provided for describing the inventions but the invention is not just limited to the embodiments as provided.

Figure 1:
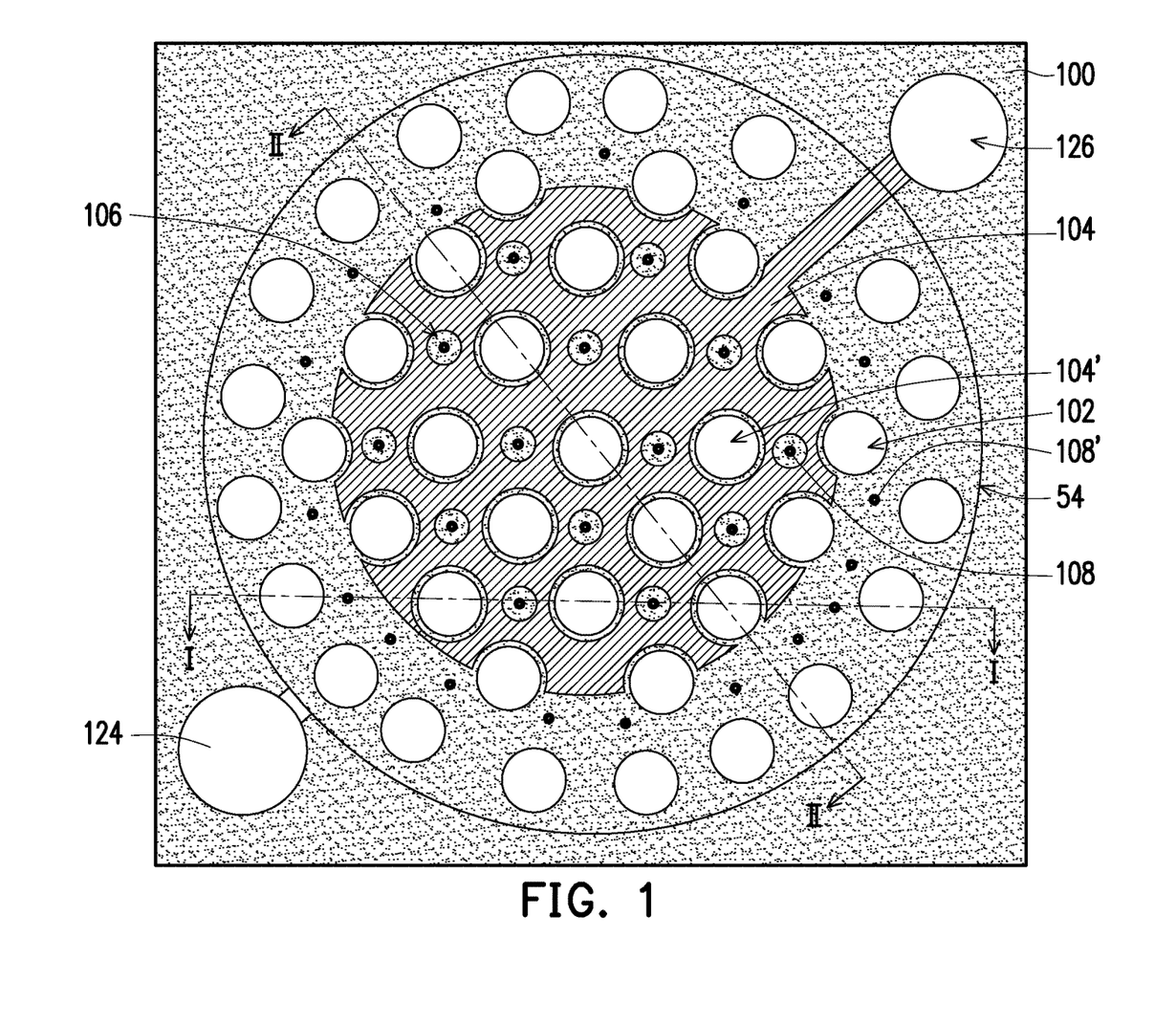
FIG. 1 is a drawing, schematically illustrating a top view over the backplate layer of a structure of MEMS microphone, according to an embodiment of the invention.
Figure 2:
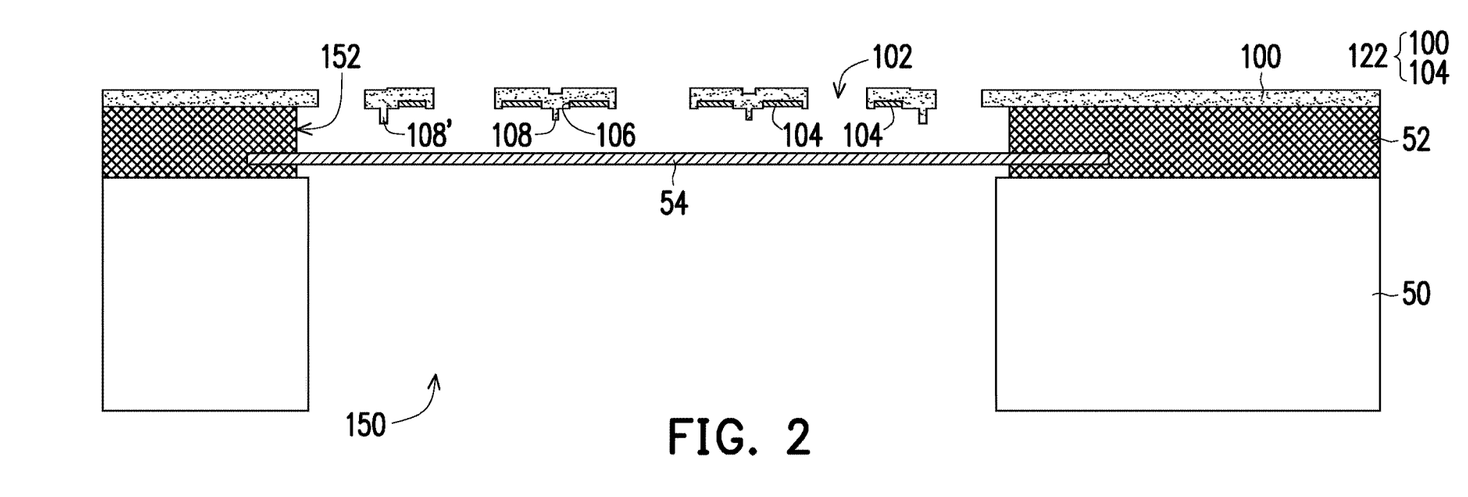
FIG. 2 is a drawing, schematically illustrating a cross-sectional structure of the MEMS microphone in FIG. 1 at the cutting line I-I, according to an embodiment of the invention.

FIG. 1 is a drawing, schematically illustrating a perspective top view over the backplate layer of a structure of MEMS microphone, according to an embodiment of the invention. FIG. 2 is a drawing, schematically illustrating a cross-sectional structure of the MEMS microphone in FIG. 1 at the cutting line I-I, according to an embodiment of the invention.

Referring to FIGS. 1 and 2, a perspective top view over the backplate layer 100 of a structure of MEMS microphone is shown in FIG. 1 while the cross-sectional structure is shone in FIG. 2. Under the backplate layer 100, as to the structure, the MEMS microphone has a substrate 50, such as the silicon substrate, to serve as a base structure. The substrate 50 has an opening 150 to expose a membrane 54 at one side. The MEMS microphone usually is packaged onto a circuit board in an example, in which the substrate 50 is disposed on the circuit board. The opening 150 of the substrate 50 becomes a chamber for allowing the vibration of the membrane 54.

A dielectric layer 52 is disposed on the substrate 50, also having an opening 152, which is corresponding to the opening 150 of the substrate 50. The active region of the membrane 54 within the opening 152 of the dielectric layer 52. The membrane 54 is conductive and serves as one of two electrodes of a capacitance. However, the peripheral region of the membrane 54 is embedded and affixed in the dielectric layer 52, so that the membrane 54 is firmly affixed within the opening 152 for vibrating according to the air pressure of the acoustic signal. The membrane 54 in FIG. 1 as the top view is just for perspective viewing, which is schematically seen in FIG. 2 corresponding to the opening 154 of the dielectric layer 54. The dielectric layer 52 in FIG. 1 is not shown.

A backplate layer 122 including the protection layer 100 and the electrode layer 104 is disposed on the substrate 50 over the opening 152 and the covering over the membrane 54. The backplate layer 122 in an embodiment includes a protection layer 100 and an electrode layer 104. The capacitance between the membrane 54 and the electrode layer 104 is varying due to the vibration of the membrane 54 in responding to the air pressure of the acoustic signal. To have the sufficient sensing capability of the membrane 54, the backplate layer has venting holes 102 to allow the air to pass through. The membrane 54 then may be more freely vibrating to sense the acoustic signal.

To increase the capacitance between the membrane 54 and the electrode layer 104, the distance between the membrane 54 and the electrode layer 104 may be greatly reduced to be rather short. In fabrication or actual operation, the membrane 54 may be sticking to the electrode layer 104, causing malfunction of the MEMS microphone. The anti-sticky structures 108 are then formed, being distributing around the venting holes 102 in an example. The locations of the anti-sticky structures 108 are not limited to the specific locations, so as to reduce the stick phenomenon between the membrane 54 and the backplate 122. To adapt the anti-sticky structures 108 for penetrating through the electrode layer 104, the electrode layer 104 has the openings 104' and the openings 106, in which the openings 104' are corresponding to the venting holes 108 and the openings are corresponding to the anti-sticky structures 108. The anti-sticky structures 108 formed from the protection layer 100 may protrude toward the membrane 54 through the openings 106 while the electrode layer 104 is covered by the protection layer 100 for protection. The side wall of electrode layer 104 within the openings 106 and the venting holes 102 are also covered by the protection layer 100 to protect by more fully covering. Here, the electrode layer 104 and the protection layer 100 form together as the backplate layer 122.

Further, some anti-sticky structures 108' may also formed at the peripheral region out of the electrode layer 104. As noted, the anti-sticky structures 108, 108' has the base part, which is corresponding to the electrode layer 104, due to the fabrication process. Then, the protruding part is extending out from the base part. In an embodiment, some venting holes 102 are additionally formed at the peripheral region out of the electrode layer 104. The distribution of the venting holes 108, 108' may be substantially uniform over the opening 152, corresponding to the membrane 54, but the invention is not limited to the specific distribution of the venting holes 108, 108'. In addition, the distribution of the anti-sticky structures 108, 108' is also to have uniform distribution, but the invention is not limited to the specific distribution of the anti-sticky structures 108, 108'.

Figure 3:
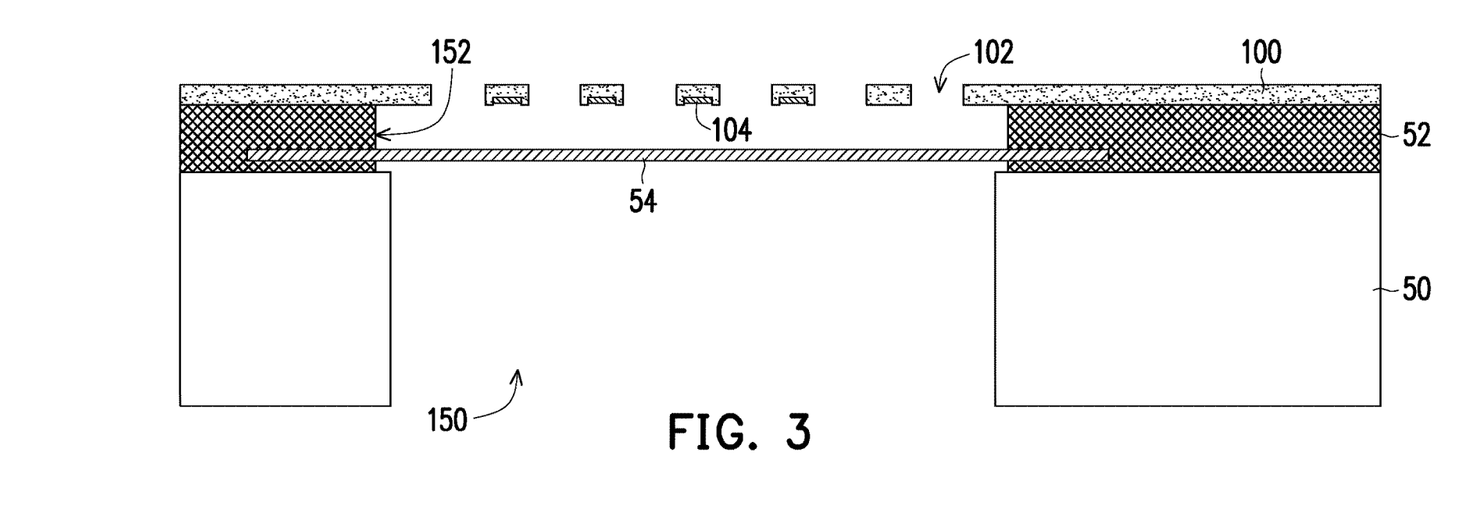
FIG. 3 is a drawing, schematically illustrating a cross-sectional structure of the MEMS microphone in FIG. 1 at the cutting line II-II, according to an embodiment of the invention.

FIG. 3 is a drawing, schematically illustrating a cross-sectional structure of the MEMS microphone in FIG. 1 at the cutting line II-II, according to an embodiment of the invention.

Referring to FIG. 1 and FIG. 3, since the cutting line II-II does not cut through the anti-sticky structures 108, 108', the cross-sectional structure does not show the anti-sticky structures 108, 108'.

In addition, from the top view in FIG. 1, the electrode structures 124 and the electrode structures 126 are formed to respectively connect to the membrane 54 and the electrode layer 104, so as to provide the operation voltages to the membrane 54 and the electrode layer 104, which form a sensing capacitor.

Figure 4:
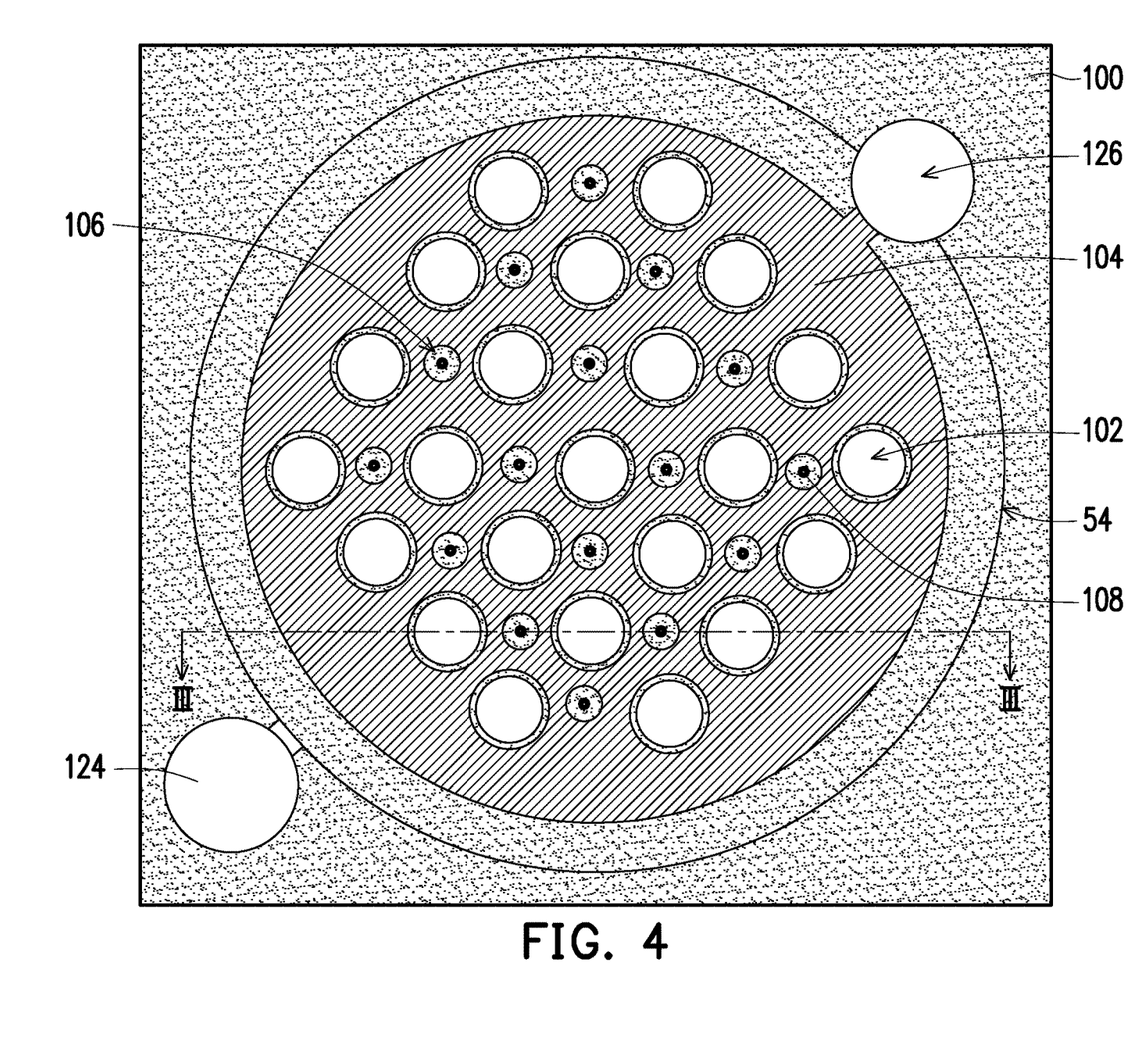
FIG. 4 is a drawing, schematically illustrating a top view over the backplate layer of a structure of MEMS microphone, according to an embodiment of the invention.
Figure 5:
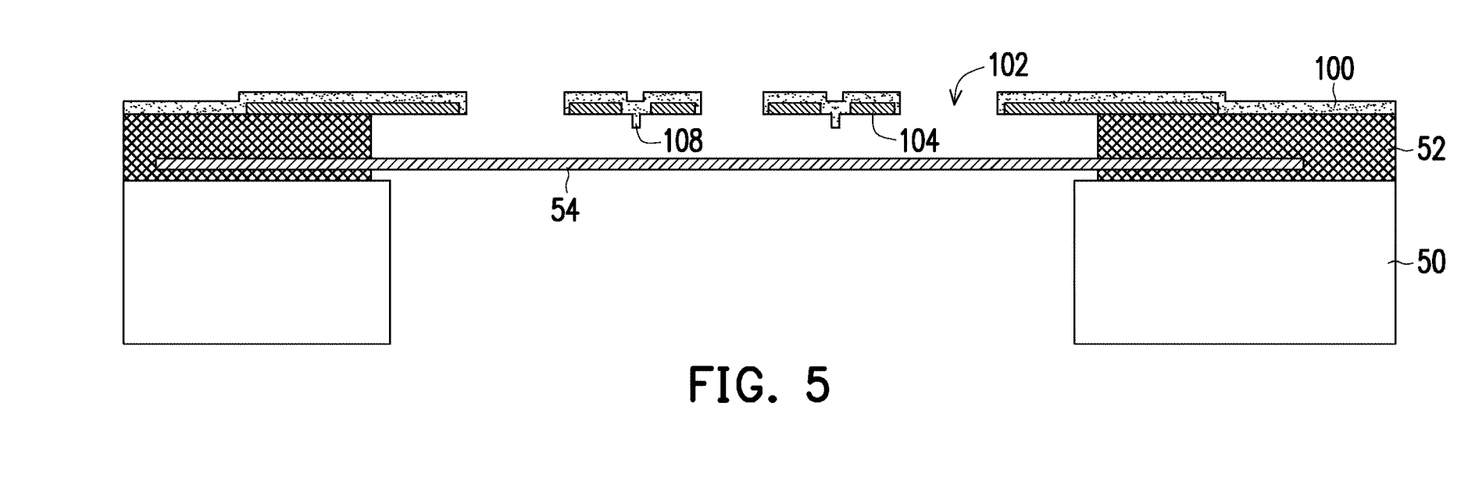
FIG. 5 is a drawing, schematically illustrating a cross-sectional structure of the MEMS microphone in FIG. 5 at the cutting line III-III, according to an embodiment of the invention.

FIG. 4 is a drawing, schematically illustrating a top view over the backplate layer of a structure of MEMS microphone, according to an embodiment of the invention. FIG. 5 is a drawing, schematically illustrating a cross-sectional structure of the MEMS microphone in FIG. 5 at the cutting line III-III, according to an embodiment of the invention.

Referring to FIG. 4 and FIG. 5, in an embodiment as previously stated, the distribution of the venting holes 102 and the distribution of the anti-sticky structures 108, 108' may be modified. In the embodiment, the venting holes 102 and the anti-sticky structures 108 are just formed within the region of the electrode layer 104. The peripheral venting hole 102 and the peripheral anti-sticky structures 108' as shown in FIG. 1 may be omitted. The anti-sticky structures 108 may relatively be formed at the central region because the vibrating amplitude at this region in actual operation. The invention is not limited to the specific distribution of the venting holes 102 and the anti-sticky structures 108.

In fabrication processes, FIG. 6A to FIG. 6E are drawing in cross-section view, schematically illustrating the processing flow of the method to fabricate the MEMS microphone, according to an embodiment of the invention.

Figure 6A:
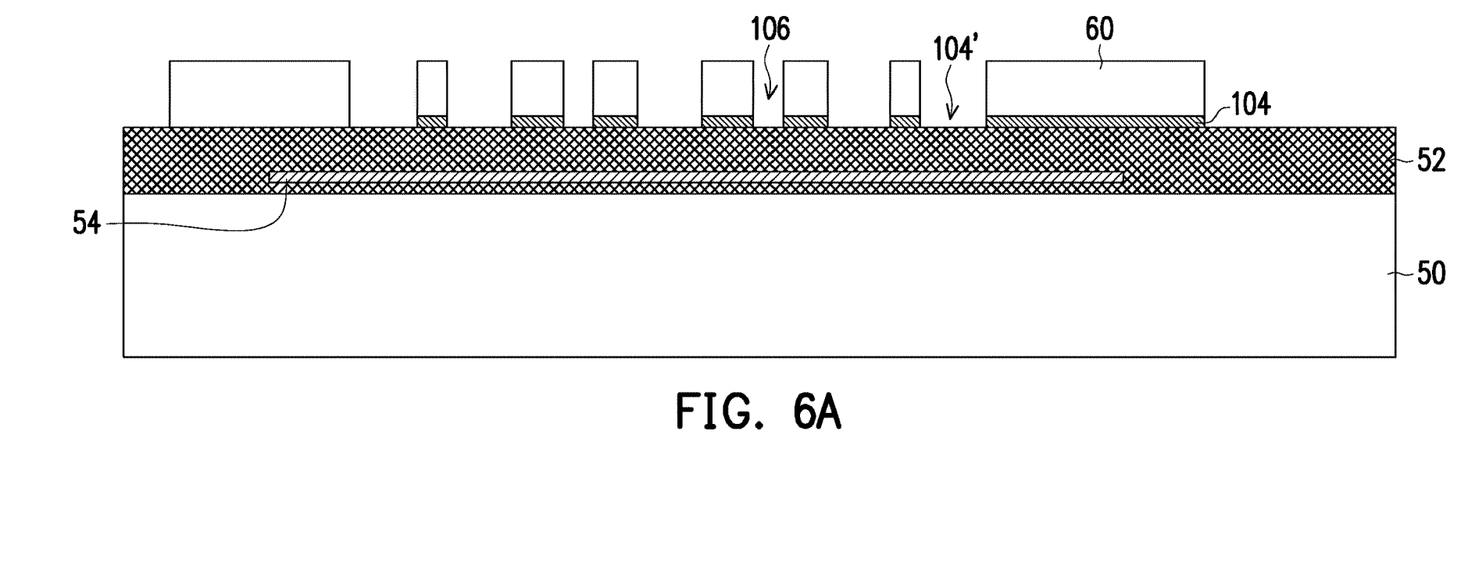
FIG. 6A to FIG. 6E are drawing in cross-section view, schematically illustrating the processing flow of the method to fabricate the MEMS microphone, according to an embodiment of the invention.

Referring to FIG. 6A, a substrate 50 is first provided for fabrication base. Then, a dielectric layer 52 is formed on the substrate 50. A membrane 54 is embedded in the dielectric layer 52. As known in fabrication, the dielectric layer 52 is an interlayer dielectric layer and may be composed of multiple layers, which are involved to form element, such as the membrane 54, in the dielectric layer 52. The detail of description is omitted here.

An electrode layer 104 as patterned through the photoresist layer 60 and etching process is disposed on the dielectric layer 52. The electrode layer 104 as patterned has the openings 104' and the openings 106. The openings 104' are corresponding to the venting holes 102 as to be formed later. The openings 106 is used to form the anti-sticky structures 108 later. The distribution of the anti-sticky structures 108 and the venting holes 102 of the backplate layer within the electrode layer 104 are preserved here.

Figure 6B:
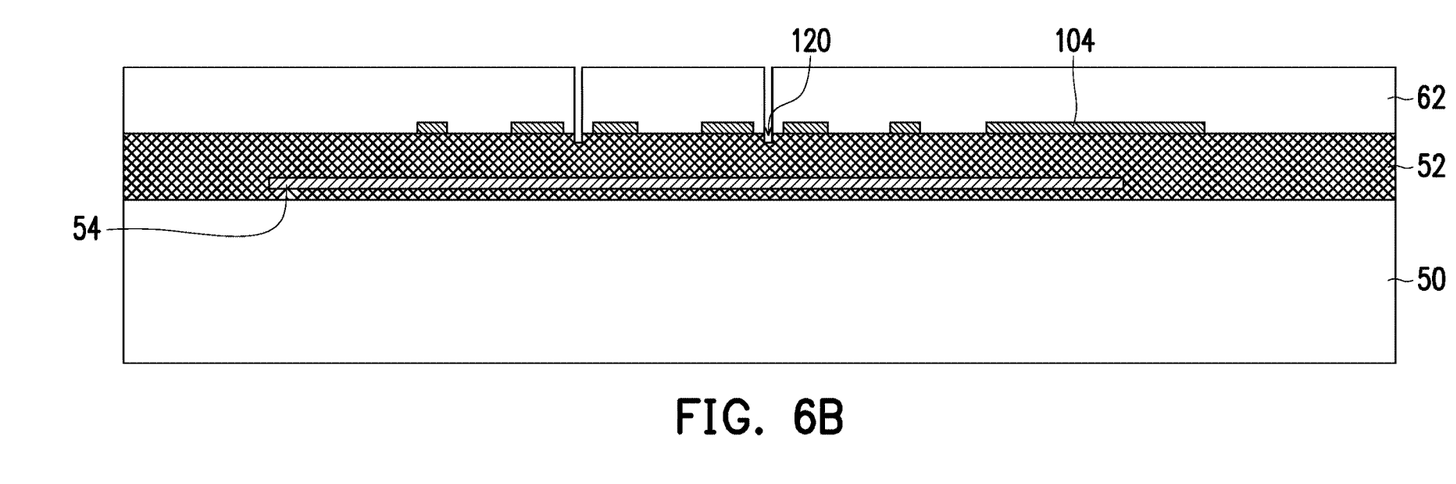

Referring to FIG. 6B, the photoresist layer 62 and etching process are used to form indents 120 in the substrate withing the openings 106. The indents 120 is used to form the protruding part of the anti-sticky structures 108 later.

Figure 6C:
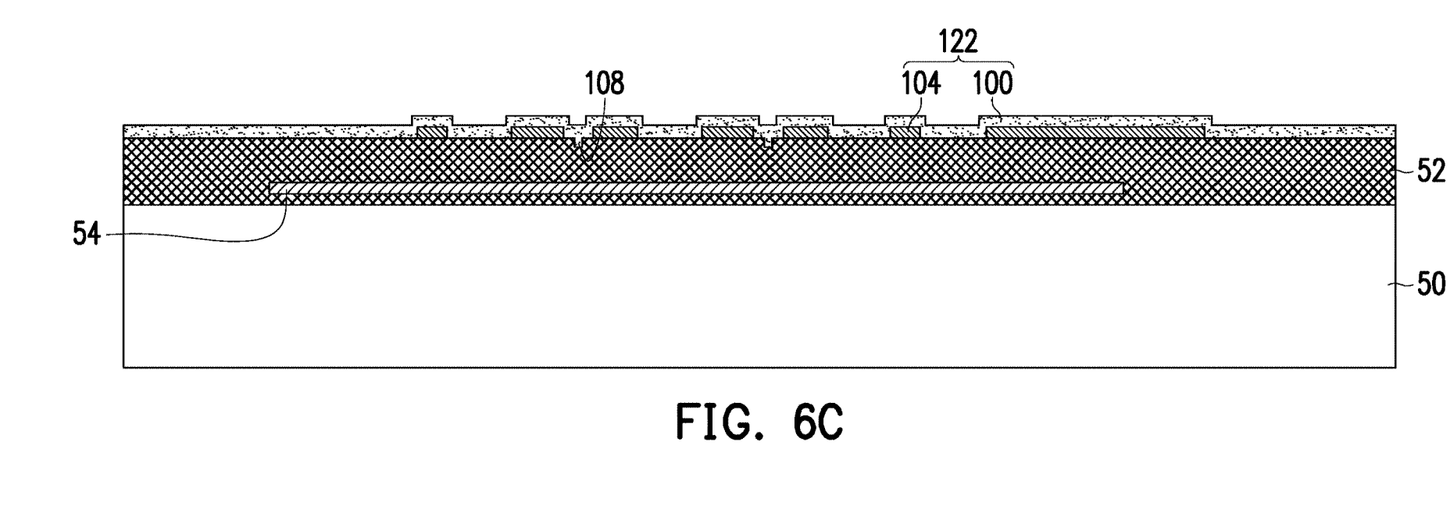

Referring to FIG. 6C, after removing the photoresist layer 62, a protection layer 100 is formed over the substrate 50 to cover the electrode layer 104. The openings 104' and the openings 106, and the indents 120 are also covered by the protection layer 100. The electrode layer 104 and the protection layer 100 form a backplate layer 122. The anti-sticky structures 108 withing the openings 106 of the electrode layer 104 are formed as well.

Figure 6D:
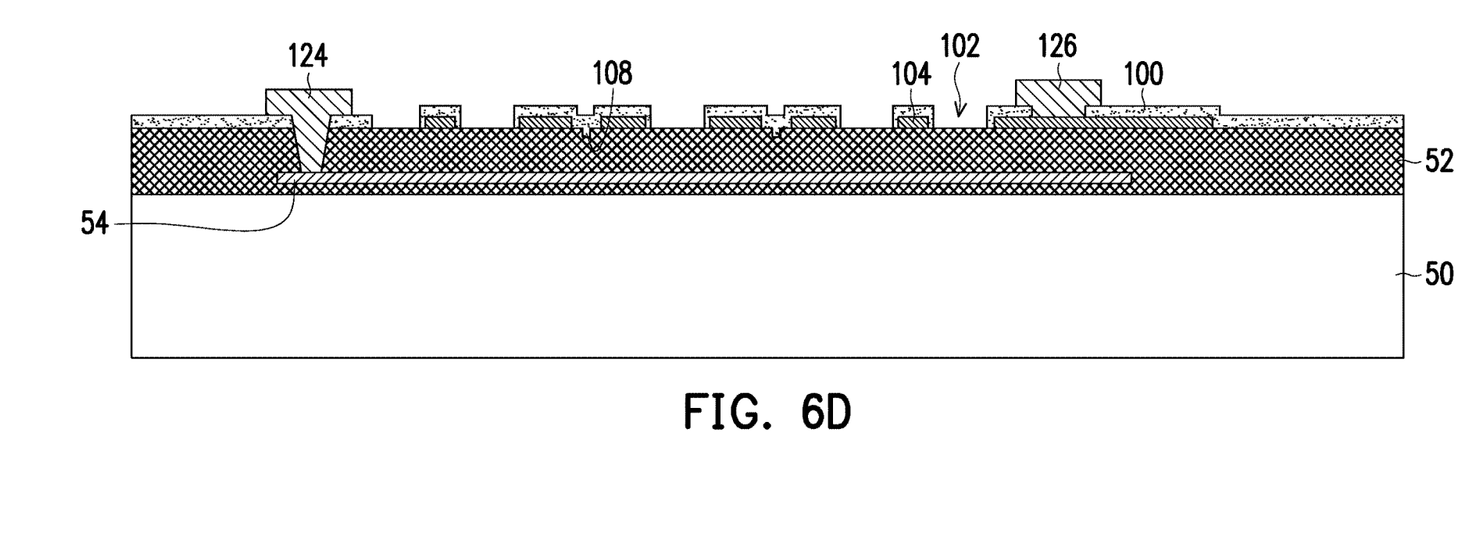

Referring to FIG. 6D, also referring to FIG. 1, the electrode layer 104 also includes an extending route over the dielectric layer 52, so as to have electric connection to the electrode structure 126. To form the electrode structure 126, the protection layer 100 is patterned to have the openings corresponding to the electrode structure 124 and the electrode structure 126. The electrode structure 124 is to be connected to the membrane 54, so that the dielectric layer 52 is further patterned to have the opening. Then, the electrode structure 124 and the electrode structure 126 are formed respectively connected to the membrane 54 and the electrode layer 104.

Figure 6E:
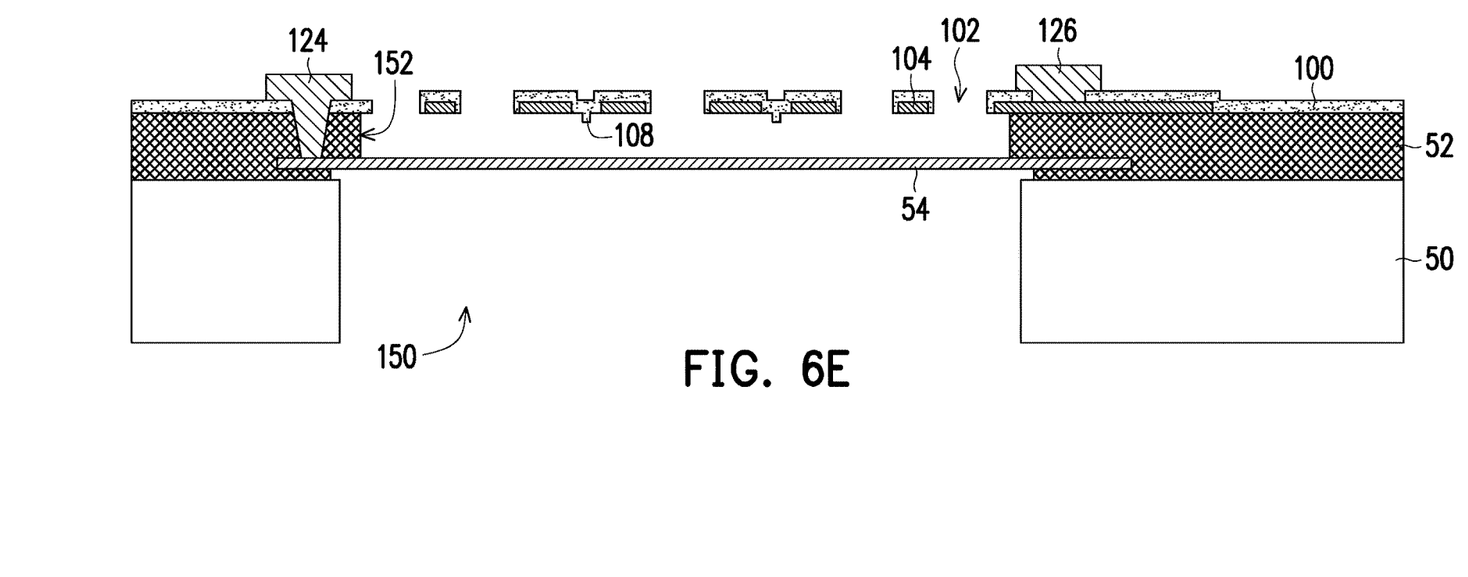

Referring to FIG. 6E, the substrate 50 is patterned to have the opening 150 to expose the dielectric layer 52 at the region corresponding to the membrane 104. Then, a part of the dielectric layer 52 is removed by etching process, such as wet etching process from the opening 150 and the openings 102 at both sides of the membrane 54. Then, the active part of the membrane 54 is exposed, as a release state for sensing the variance of air pressure. The anti-sticky structures 108 with the material such as nitride of the protection layer 100 is different from the dielectric layer 52, such as oxide. As a result, the anti-sticky structures 108 reserved within the opening 106.

In an embodiment, the MEMS microphone is formed, including the anti-sticky structures 108, 108', which are formed on the backplate layer. The anti-sticky structures 108, 108' as a part of the protection layer penetrates the electrode layer 104 around the venting holes 102. The anti-sticky structures 108, 108' may avoid the membrane 54 from sticking to the backplate layer 122.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of micro-electro-mechanical-system (MEMS) microphone, comprising:
    a substrate, having a first opening;
    a dielectric layer, disposed on the substrate, wherein the dielectric layer has a second opening aligned to the first opening;
    a membrane, disposed within the second opening of the dielectric layer, wherein a peripheral region of the membrane is embedded into the dielectric layer at sidewall of the second opening; and
    a backplate layer, disposed on the dielectric layer, the backplate layer comprising:
        a protection layer, having a peripheral region disposed on the dielectric layer and a central region with venting holes over the second opening, wherein the central region of the protection layer further has anti-sticky structures at a side of the protection layer toward the membrane, and wherein the protection layer is disposed on the top surface of the dielectric layer and is not in contact with the substrate; and
        an electrode layer, disposed on the side of the protection layer, surrounding the anti-sticky structures, and the anti-sticky structures are distributed at an inner region within the electrode layer and an outer region out of a periphery of the electrode layer.

2. The structure of MEMS microphone as recited in claim 1, wherein each of the anti-sticky structures comprises a base part and a protruding part, the base part is an indent part of the protection layer and the protruding part is protruding from the base part.

3. The structure of MEMS microphone as recited in claim 1, wherein a side wall of the venting holes of the protection layer covers a sidewall of the electrode layer corresponding to the venting holes.

4. The structure of MEMS microphone as recited in claim 1, wherein the anti-sticky structures are distributed around the venting holes.

5. The structure of MEMS microphone as recited in claim 1, wherein the electrode layer is an electrode to receive an operation voltage signal and the membrane receives a ground voltage.

6. The structure of MEMS microphone as recited in claim 1, wherein the electrode layer includes a plurality of holes to expose the anti-sticky structures.

7. The structure of MEMS microphone as recited in claim 1, wherein the anti-sticky structures are distributed at a region within the electrode layer.

8. The structure of MEMS microphone as recited in claim 1, wherein the electrode layer is within the second opening of the dielectric layer.

9. The structure of MEMS microphone as recited in claim 1, wherein the electrode layer has a central electrode part within the second opening of the dielectric layer and a peripheral electrode part disposed on the dielectric layer and covered by the protection layer.

10. A method for fabricating MEMS microphone, comprising:
    providing a substrate;
    forming a dielectric layer on the substrate, wherein a membrane is embedded in the dielectric layer;
    forming an electrode layer on the dielectric layer, wherein the electrode layer has a plurality of first openings and a plurality of second openings over the membrane, wherein the second openings are distributed surrounding the first openings;
    forming an indent in the dielectric layer within each of the second openings of the electrode layer;
    forming a protection layer, covering on the electrode layer to form a backplate layer, wherein a portion of the dielectric layer with the indents within the second openings are also covered by the protection layer while a portion of the dielectric layer within the first openings of the electrode layer is exposed by the protection layer, and wherein the protection layer is formed on the top surface of the dielectric layer and not in contact with the substrate;

forming a first electrode structure in the dielectric to contact the membrane and a second electrode structure on the protection layer to contact the electrode layer;

patterning the substrate to have a substrate opening corresponding to the membrane to expose the dielectric layer; and etching a portion of the dielectric layer corresponding to the substrate opening to expose a portion of the membrane, wherein the electrode layer is also exposed and a portion of the protection layer within the second openings of the electrode layer is also exposed to form anti-sticky structures, and the anti-sticky structures as formed are distributed at an inner region within the electrode layer and an outer region out of a periphery of the electrode layer.

11. The method for fabricating MEMS microphone as recited in claim 10, wherein each of the anti-sticky structures comprises a base part and a protruding part, the base part is within the second openings of the electrode layer and the protruding part is within the indent and protruding from the base part.

12. The method for fabricating MEMS microphone as recited in claim 10, wherein the first openings of the electrode layer provide venting holes of the backplate layer.

13. The method for fabricating MEMS microphone as recited in claim 12, wherein the anti-sticky structures are distributed around the venting holes.

14. The method for fabricating MEMS microphone as recited in claim 10, wherein the second electrode structure is to receive an operation voltage signal for the electrode layer and the first electrode structure receives a ground voltage for the membrane.

15. The method for fabricating MEMS microphone as recited in claim 10, wherein a location and a size of the second openings of the electrode layer are reserved to form the anti-sticky structures.

16. The method for fabricating MEMS microphone as recited in claim 10, wherein the anti-sticky structures as formed are distributed at a region within the electrode layer.

17. The method for fabricating MEMS microphone as recited in claim 10, wherein the electrode layer as formed is within the substrate opening.

18. The method for fabricating MEMS microphone as recited in claim 10, wherein the electrode layer as formed has a central electrode part within the second opening of the dielectric layer and a peripheral electrode part disposed on the dielectric layer and covered by the protection layer.

* * * * *